United States Patent
Rogojina

(10) Patent No.: US 9,196,486 B2
(45) Date of Patent: Nov. 24, 2015

(54) INORGANIC PHOSPHATE CONTAINING DOPING COMPOSITIONS

(71) Applicant: Elena Rogojina, Los Altos, CA (US)

(72) Inventor: Elena Rogojina, Los Altos, CA (US)

(73) Assignee: Innovalight, Inc., Sunnyvale, CA (US)

( * ) Notice: Subject to any disclaimer, the term of this patent is extended or adjusted under 35 U.S.C. 154(b) by 278 days.

(21) Appl. No.: 13/661,515

(22) Filed: Oct. 26, 2012

(65) Prior Publication Data

US 2014/0120705 A1   May 1, 2014

(51) Int. Cl.
*H01L 21/38* (2006.01)
*H01L 21/22* (2006.01)
*H01L 21/228* (2006.01)
*H01L 31/18* (2006.01)

(52) U.S. Cl.
CPC .............. *H01L 21/22* (2013.01); *H01L 21/228* (2013.01); *H01L 21/2225* (2013.01); *H01L 31/1804* (2013.01); *Y02E 10/547* (2013.01)

(58) Field of Classification Search
CPC .................................................. H01L 21/2225
USPC .......... 438/542, 557, 558, 562, 510; 257/E21.14, E21.153
See application file for complete search history.

(56) References Cited

U.S. PATENT DOCUMENTS

| | | | |
|---|---|---|---|
| 3,841,927 A | | 10/1974 | Florence et al. |
| 3,920,882 A | | 11/1975 | Venkatu |
| 3,931,056 A | * | 1/1976 | Myles et al. ............. 252/520.22 |
| 3,998,668 A | * | 12/1976 | Florence et al. ................. 148/22 |
| 4,243,427 A | * | 1/1981 | DiBugnara .............. 106/287.16 |
| 4,891,331 A | | 1/1990 | Rapp |
| 5,926,727 A | | 7/1999 | Stevens et al. |
| 6,695,903 B1 | | 2/2004 | Kuebelbeck et al. |
| 6,998,288 B1 | | 2/2006 | Smith et al. |
| 8,053,867 B2 | | 11/2011 | Juang et al. |
| 2003/0134469 A1 | | 7/2003 | Horzel et al. |
| 2010/0048006 A1 | * | 2/2010 | Huang et al. .................. 438/542 |
| 2011/0045624 A1 | | 2/2011 | Tsukigata et al. |
| 2012/0145967 A1 | | 6/2012 | Rogojina et al. |

FOREIGN PATENT DOCUMENTS

| | | |
|---|---|---|
| JP | 51-003778 | 1/1976 |
| JP | 2007-053353 A | 3/2007 |
| RU | 1292622 | 3/1995 |

OTHER PUBLICATIONS

International Search Report and Written Opinion, PCT/US2013/066781, Filed Oct. 25, 2013.

* cited by examiner

*Primary Examiner* — Julia Slutsker

(74) *Attorney, Agent, or Firm* — Foley & Lardner LLP

(57) ABSTRACT

A composition for doping semiconductor materials, such as silicon, may contain a) a solvent and a) an inorganic salt of a phosphor containing acid dispersed in the solvent. Also disclosed are doping methods using such composition as well as methods of making the doping composition.

15 Claims, 6 Drawing Sheets

Diagram of Phosphorus dopant spreading during diffusion

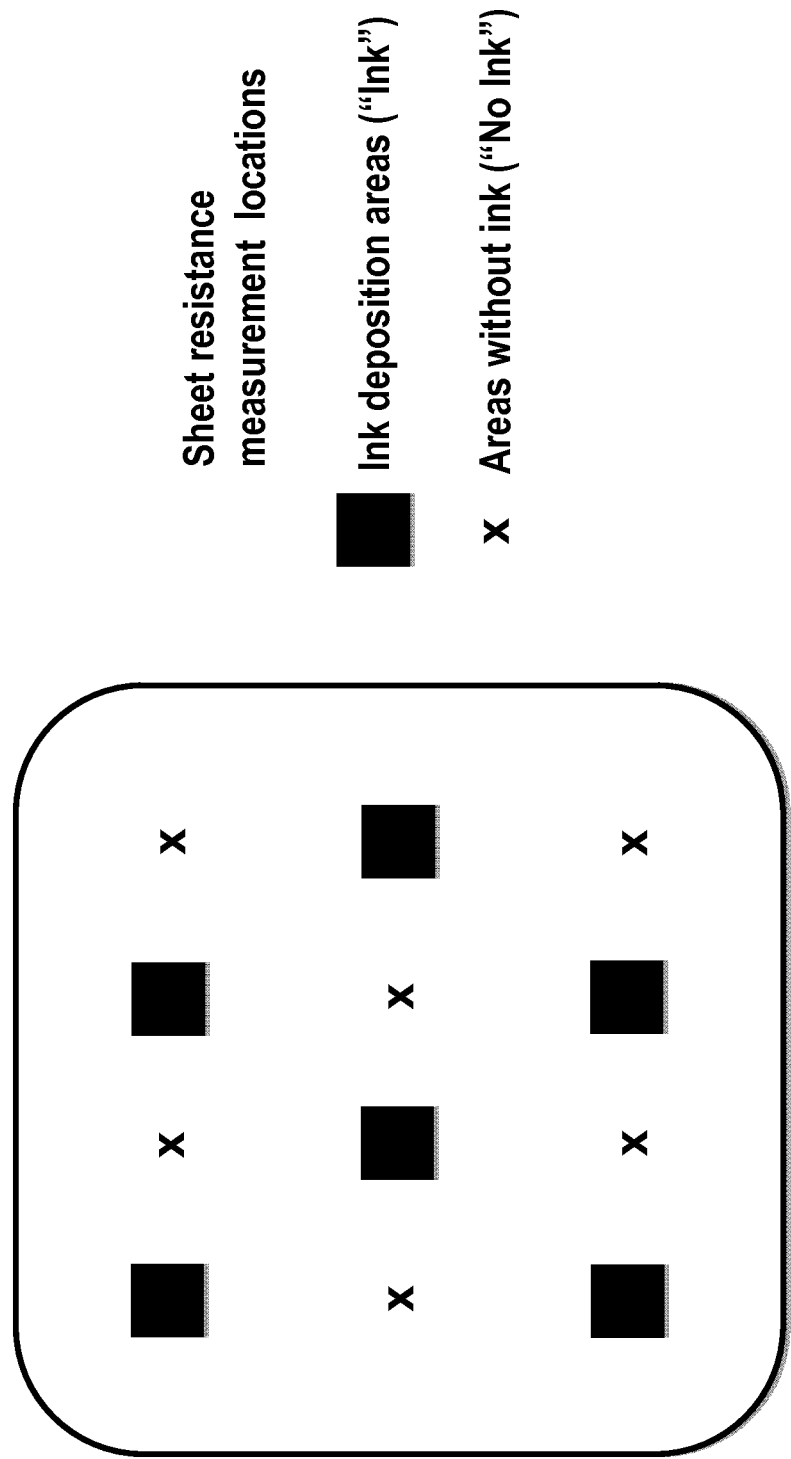

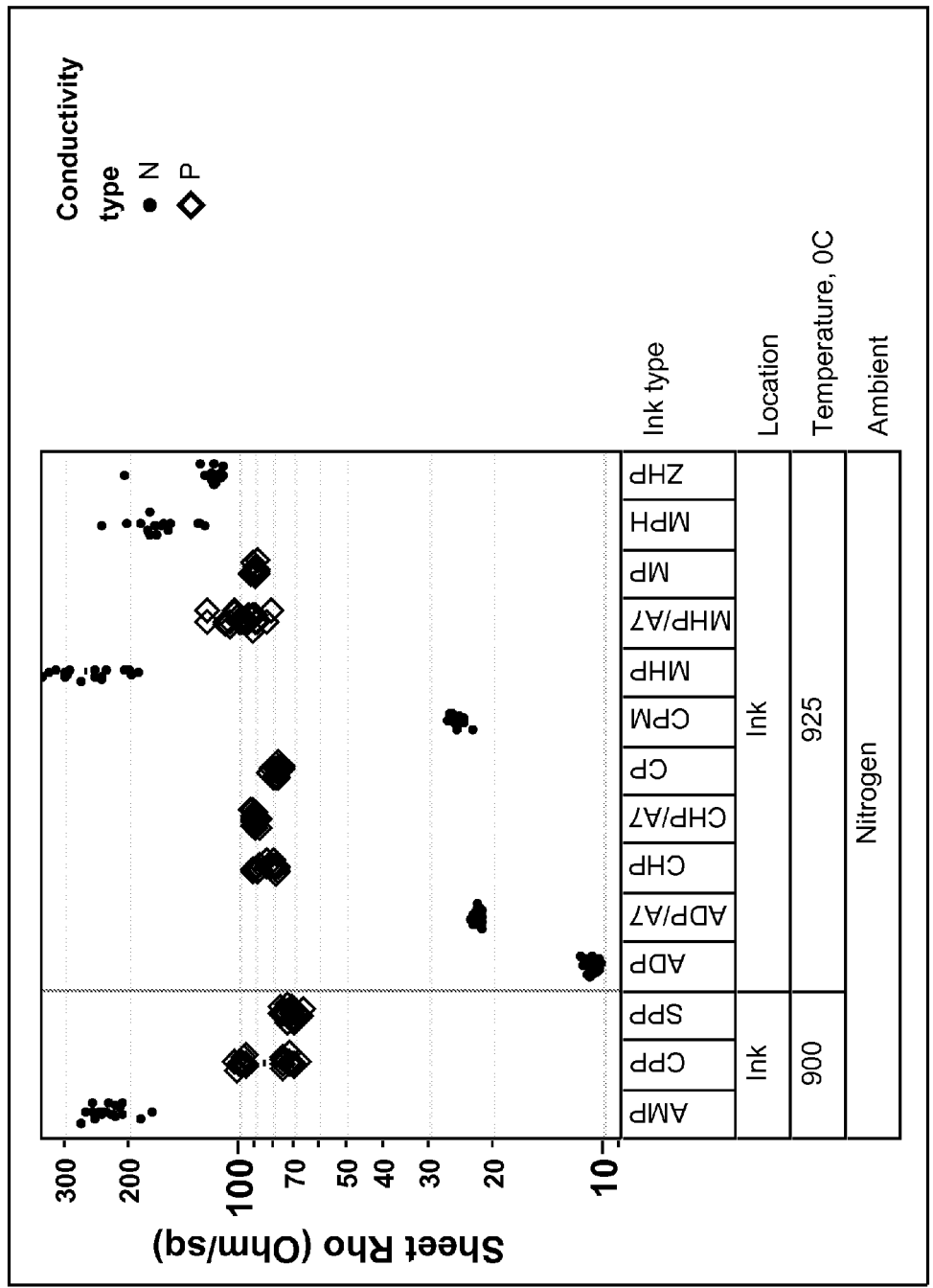
Fig.2A: Doping from metal phosphates/ Nitrogen

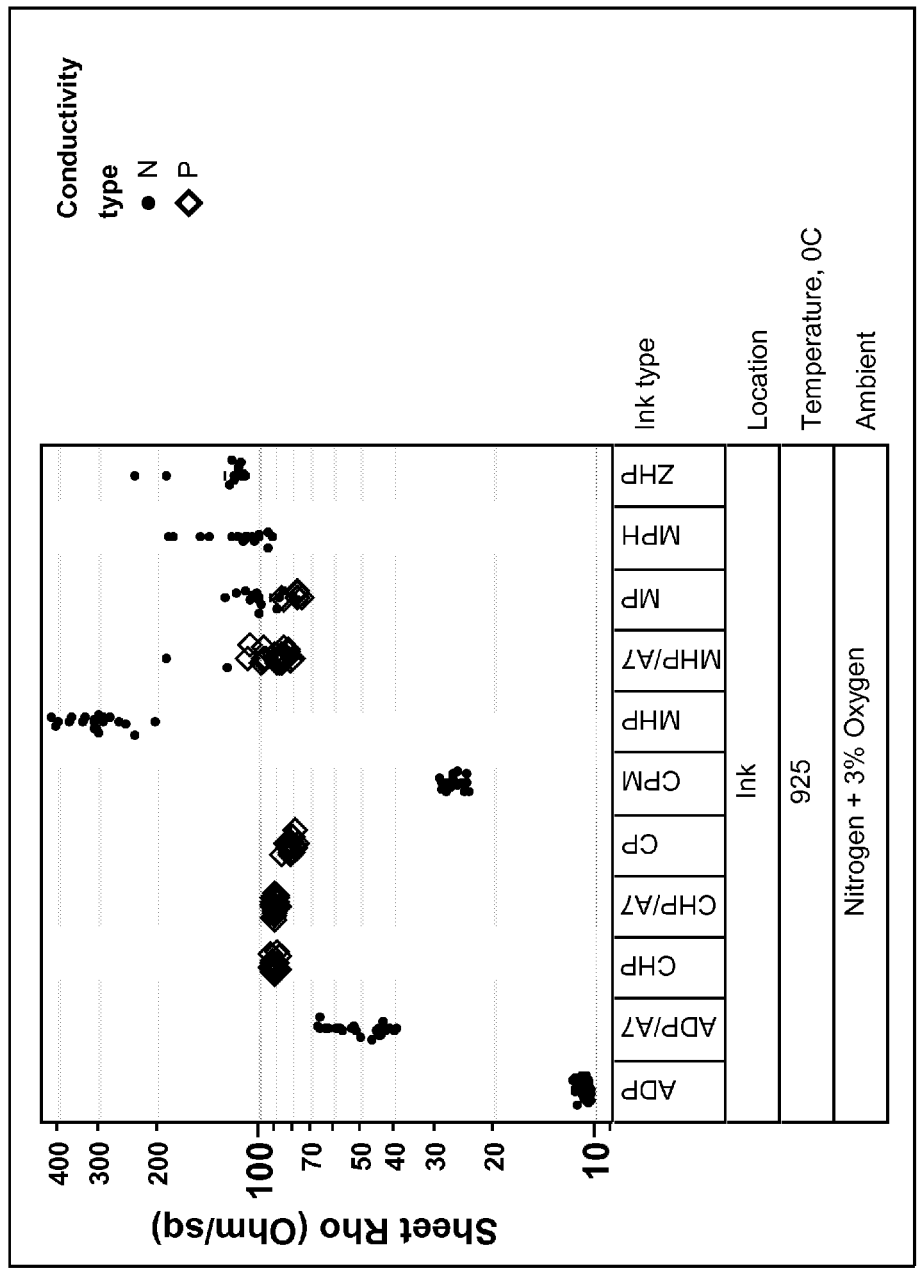
Fig.2B: Doping from metal phosphates/ Nitrogen + 3% Oxygen

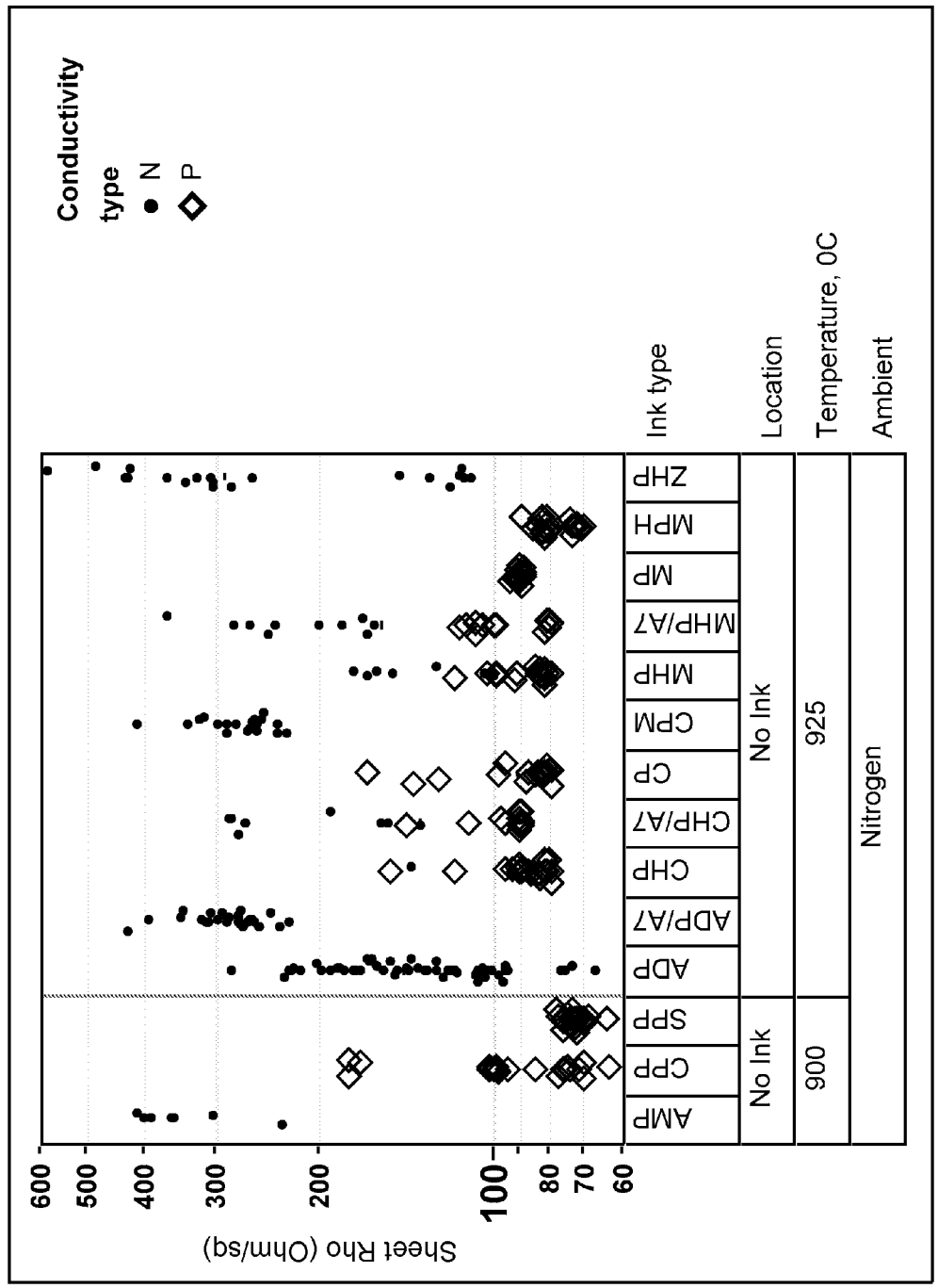

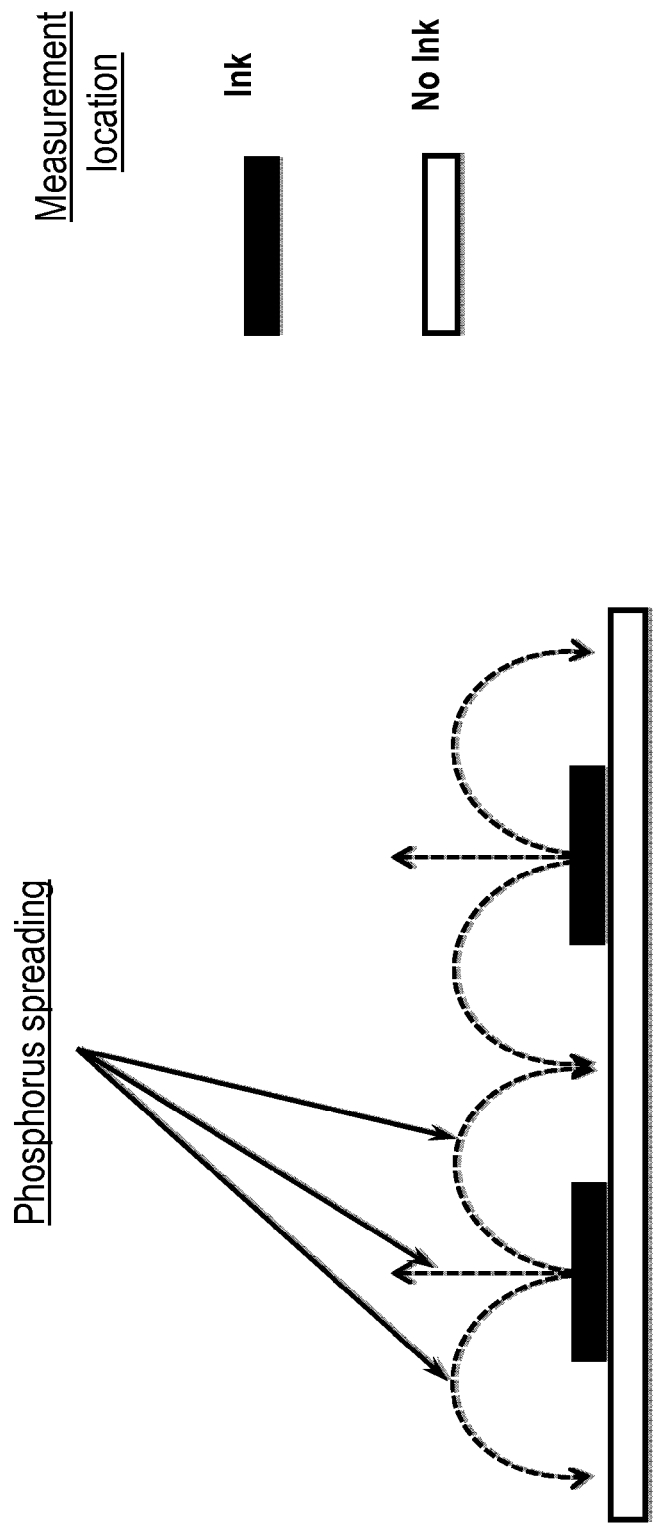
Fig.4: Diagram of Phosphorus dopant spreading during diffusion

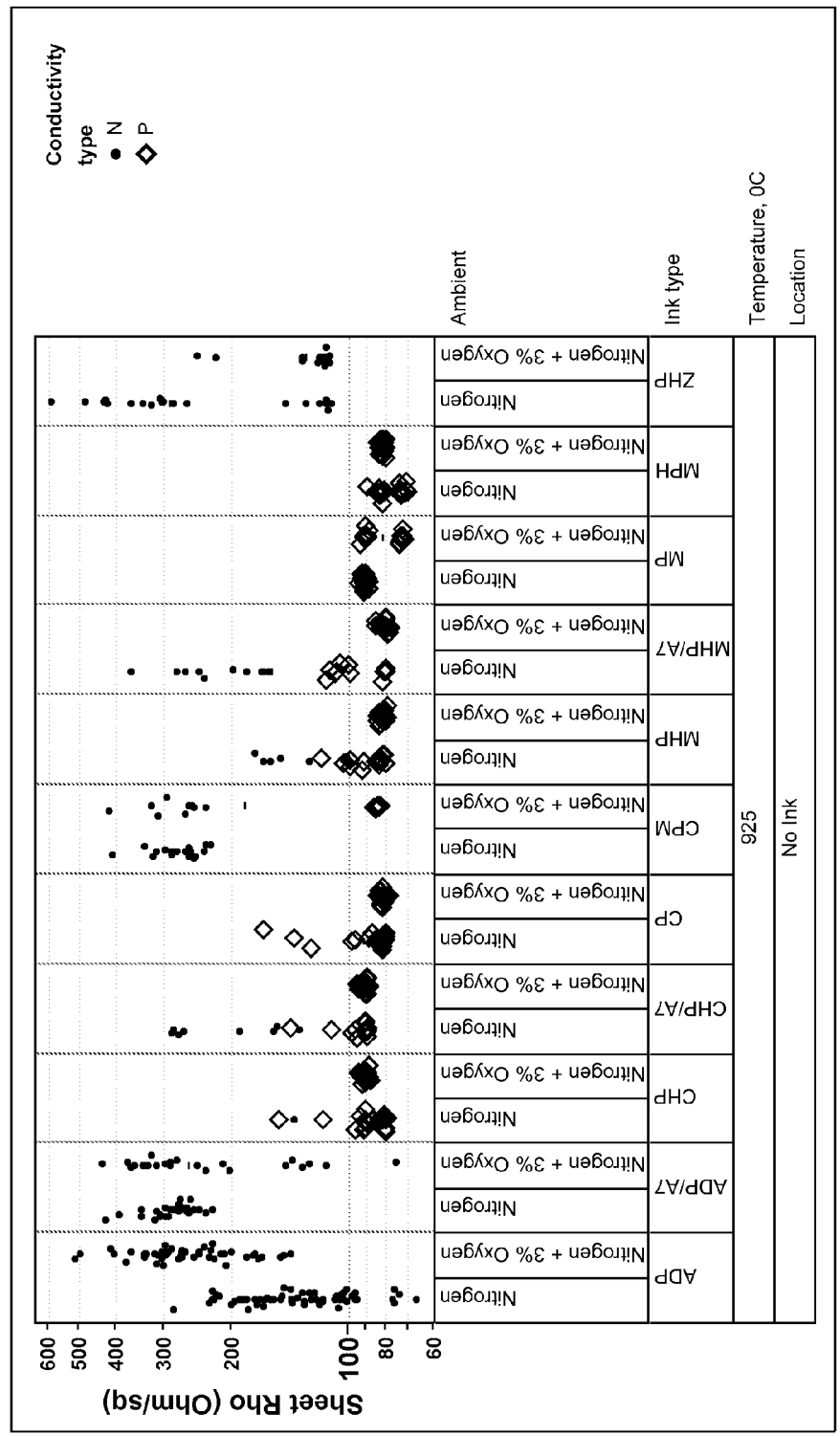
Fig.5: Autodoping suppression by oxygen addition

INORGANIC PHOSPHATE CONTAINING DOPING COMPOSITIONS

FIELD

The present application generally relates to the semiconductor field and in particular, to inorganic phosphate containing doping compositions as well as to methods of their making and their use.

SUMMARY

One embodiment is a semiconductor doping method comprising: (A) obtaining a substrate comprising a semiconductor material and (B) contacting at least a portion of a surface of the substrate with an effective amount of a doping composition comprising a) a solvent and b) an inorganic salt of a phosphor containing acid dispersed in said solvent.

Another embodiment is A semiconductor doping method comprising: (A) obtaining a substrate comprising a semiconductor materials and (B) contacting at least a portion of a surface of the substrate with an effective amount of an inorganic salt of a phosphor containing acid, wherein the salt is selected from the group consisting of $Al(H_2PO_4)_3$, $Al(PO_3)_3$, $Ca_3(PO_4)_2$, $CaHPO_4$, $Ca(H_2PO_4)_2$, $Ca_2P_2O_7$, $MgHPO_4$, $Mg_3(PO_4)_2$, $Zr(HPO_4)_2$, $Na_4P_2O_7$ and combinations thereof.

FIGURES

FIG. 1 shows a pattern for screen printing an inorganic phosphate-containing doping paste, and sheet resistance measurement locations ('Ink' and 'No Ink' areas referring to printed with the doping paste patches and not-printed areas).

FIG. 2A-B show plots of a sheet resistance of areas on P-type substrates, printed with the inorganic phosphate-containing doping pastes ("Ink" areas), after diffusion in Nitrogen (A) and Nitrogen with 3% of Oxygen (B) ambient.

FIG. 3 shows a plot of a sheet resistance of areas on P-type substrates, located between the patches of the inorganic phosphate-containing doping pastes, after diffusion ("No Ink" areas).

FIG. 4 schematically illustrates a process of gas phase transfer of phosphorus dopant from "Ink" areas to areas, where the phosphate containing paste was not deposited ("No Ink"), resulting in N-type doping of these areas during diffusion process, i.e. "autodoping".

FIG. 5 shows plot of a sheet resistance of areas on P-type substrates, located between the patches of the inorganic phosphate-containing doping pastes ("No Ink" areas), after diffusion in Nitrogen and Nitrogen with 3% Oxygen ambient.

DETAILED DESCRIPTION

Unless otherwise specified, "a" or "an" means one or more.

The present inventor discovered that an inorganic salt of a phosphor containing acid may be used for doping a semiconductor. In many embodiments, the inorganic salt of phosphor containing acid may be in a form of a doping composition, which may be a liquid or a fluid. In certain embodiments, the doping composition may be such that the inorganic salt of the phosphor containing acid may be dispersed in a solvent.

The inorganic salt containing composition may have a number of advantages compared to prior art methods that involve using phosphor containing acids, such as a phosphoric acid for doping semiconductors. Some prior art methods may involve depositing a layer of a phosphoric acid containing composition, such as a paste on a semiconductor wafer, such as a silicon wafer first. The wafer then may undergo thermal treatment at high temperatures, such as 800° C. or higher to drive phosphorous atoms into the wafer. In many cases, such phosphoric acid containing doping compositions may be formulated from organo-oxysilanes $Si(OR)_4$ (R=alkyl, Aryl, etc.) or metallorganic compounds $Me(OR)_x$ (Me=Al, Ti, Zn, Zr, etc.; R=alkyl, Aryl, etc.) via controlled sol-gel process. However, acidic pH of phosphoric acid may accelerate gelation process of such sol-gel doping composition, which may cause a significant change in the compositions viscosity, and/or its segregation.

Another restriction for use of phosphor containing acids, such as a phosphoric acid, as a semiconductor doping source may be their chemical reactivity. For example, phosphoric acid may affect one or more polymer binders, which are used as a component of many doping paste compositions. Many of polymers commonly used as binders, such as polyvinyl alcohol, cellulose, polyacrylic and polymethacrylic acids and their ethers and esters, are polymers bearing OH groups. Phosphoric acid would interact with a polymer bearing OH groups, and such interaction would result into phosphate esters formation and cross-linking of polymer chains, causing composition's gelling, which is undesirable.

Many other phosphorus containing materials are also unsuitable for doping formulations, such as pastes. For example, Phosphorus (III) compounds as Phosphides, for example, AlP or InP, are unstable under ambient conditions, and may react with moisture with formation of toxic phosphine gas $PH_3$. The only relatively stable under ambient conditions solid elemental phosphorus compound is red phosphorous. However, it is highly flammable in a form of a fine powder, which may be needed for a printable doping formulation, such as a paste. Compared to doping compositions based on phosphor containing acids, such as a phosphoric acid, the present composition may be more robust and inert. The present composition comprising an inorganic salt of a phosphor containing acid may be processed at higher temperatures. Furthermore, inorganic salts of a phosphor containing acid do not interact with binding polymers and/or other components, which may be used in doping compositions, such as pastes.

The present composition may be used for doping a number of substrates, which comprise a semiconductor material. In many embodiments, the semiconductor material may be a Group IV semiconductor material, such as silicon or germanium, which may be pure/undoped or doped (N or P type). In the case of Group IV material, the inorganic salt of the phosphoric acid may N-type dope the substrate by diffusing its phosphorous atoms into the substrate. The silicon containing substrate may include monocrystalline silicon, polycrystalline silicon or silicon admixed with one or more other elements such as germanium or carbon. In some embodiments, the semiconductor material may be a Group III-V semiconductor material, such as Gallium arsenide, or Group II-VI semiconductor material, such as ZnO or ZnTe. The inorganic salt may be a salt of at least one of phosphor containing acids. In some embodiments, the salt forming phosphor containing acid may be an orthophosphoric acid ($H_3PO_4$). In some embodiments, the salt forming phosphor containing acid may be an oligophosphoric or polyphosphoric acid, which is a product of an orthophosphoric acid condensation formed by joining two or more orthophosphoric acid molecules, while eliminating water. The oligo- or polyphosphoric acid may form a linear/chain structure, a branched structure or a ring or cyclic structure. Examples of phosphor containing acids include, but not limited to, are phosphorus acid $H_3PO_3$, hypophosphorus acid $H_3PO_2$, metaphosphoric acid $HPO_3$, orthophosphoric acid $H_3PO_4$, and products of its condensation such as pyrophosphoric acid, trimetaphosphoric acid, tripolyphosphoric acid, tetrapolyphosphoric acid, and higher linear polyphosphoric acids having formula:

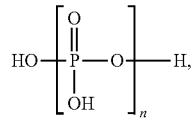

where n>4. Phosphor containing acids are generally known of ordinary skill in the art.

In many embodiments, the inorganic salt of the phosphor containing acid may be a metal salt of the phosphor containing acid. In many embodiments, more than one metal salt of the phosphor containing acid may be used. The metal in the salt may be, for example, from Group I, II, III or IV. In some embodiments, the salt forming metal may be from Group II, III or IV. Yet in some embodiments, the salt forming metal may be from Group II or III. In some embodiments, the salt may be formed by one or more metal. Examples of salt forming metals include, but not limited to, Al, Ca, Mg, Ba, Ce, Hf, Ta, Ti, La and Zr. In some embodiments, the salt may be selected from the group consisting of $Al(H_2PO_4)_3$, $Al(PO_3)_3$, $Ca_3(PO_4)_2$, $CaHPO_4$, $Ca(H_2PO_4)_2$, $Ca_2P_2O_7$, $MgHPO_4$, $Mg_3(PO_4)_2$, $Zr(HPO_4)_2$, $Na_4P_2O_7$ and combinations thereof.

The inorganic salt of the phosphor containing acid may constitute from 0.5% to 99% by weight of the doping composition, or from 1% 98% or from 2% to 95% or from 3% to 90% or from 5% to 85% or any subrange within these ranges. Preferably, the inorganic salt of the phosphoric acid is applied in an effective amount, which may be an amount necessary to achieve a desired level of doping in a semiconductor. The effective amount may depend on a number of parameters; such parameters of a particular inorganic salt of a phosphor containing acid as its phosphorous content and its thermal decomposition path; an initial doping level of a semiconductor and a final desired doping level of the semiconductor.

Doping strength may be monitored by a sheet resistance of a semiconductor. For a given majority carrier type (N- or P-type), higher sheet resistance value corresponds to a lower doping strength.

Doping of a semiconductor using an inorganic salt of a phosphor containing acid may lead to a reduction of the semiconductor's sheet resistance (SRO) by at least 1.2 times or by at least 1.5 times or by at least 2 times or by at least 3 times or by at least 5 times or by at least 15 times or by at least 20 times or by at least 30 times or by at least 50 times or at 100 times or at least 200 times or at least 300 times or at least 500 times or at least 1000 times, and/or change in majority carrier type (for example, P- to N-type).

A care must be exercised when comparing two SRO values because a particular SRO value depends on a number of parameters, such as a substrate type, a doping composition's type and strength. In case, when both the substrate and the doping composition have the same type carriers, e.g. when the substrate is N-doped and the doping composition is N-type or when the substrate is P-doped and the doping composition is P-type, doping using the doping composition would result in a drop of the SRO of the substrate. However, when the substrate and the doping composition are of opposite types, for example the substrate is P-type, but the doping composition is N-type, the situation may be more complicated.

When an N-type dopant starts to diffuse into a P-type substrate the additional N-type carriers may compensate the base substrate doping by reducing the active carrier concentration and increasing the SRO. The SRO may initially increase by 1.2 times or by at least 1.5 times or by at least 2 times or by at least 5 times or by at least 10 times or by at least 50 times by at least 100 times or by at least 200 times or by at least 500 times or by at least 1000 times or by at least 2000 times or by at least 5000 times or by at least 10000 times. As more N-type dopants are incorporated into the substrate the majority carrier type becomes N-type and the SRO decreases.

In some embodiments, the inorganic salt of the phosphor containing acid may be an acidic salt of a phosphor containing acid, i.e. a salt, which has one or more hydrogen atoms of the parent acid. For example, for orthophosphoric acid, acidic salts may be dihydrophosphate and hydrophosphate salts. Acidic salts are generally known to those skilled in the art.

In some embodiments, it may be preferred to use an acidic salt, such as dihydrophosphate and hydrophosphate salts; in the doping composition as such a salt may provide a stronger doping. In some embodiments, it may be preferred to use an acidic salt containing multiple, i.e. more than 1, hydrogen atoms, such as dihydrophosphate, as such a salt may provide stronger doping.

In some embodiments, the salt may be a hydrous salt, i.e. a salt with one or more water molecules bound to the salt molecule. Yet in some embodiments, the salt may be an anhydrous salt. Both hydrous and anhydrous salts are known to those of ordinary skill in the art.

Preferably, the doping composition does not contain a phosphoric acid or a phosphorous oxide, which may mean that neither any phosphoric acid nor any phosphorous oxide is present in the composition.

Preferably, the doping composition does not contain an alkaline material, such as those disclosed in U.S. Pat. No. 8,053,867 and more specifically in its column 7. Thus, the doping composition does not contain any of the following ammonia alkaline materials: ammonia alkaline materials such as ammonia hydroxide $(NH_4)OH$, tetramethylammonium hydroxide (TMAH), $(NR_7R_8R_9R_{10})OH$, $(NR_7R_8R_9H)OH$, $(NR_7R_8H_2)OH$, $(NR_7H_3)OH$, where $R_7$, $R_8$, $R_9$, and $R_{10}$ are alkyls, aryls, or the like.

Preferably, the composition containing the inorganic salt of the phosphor containing acid is a suspension, which besides an inorganic phosphate may contain a solvent. In such a case, the doping process may involve contacting a portion of a surface of the semiconductor substrate with the doping composition containing the inorganic salt of a phosphor containing acid. In many embodiments, the doping composition may be a dispersion, in which the inorganic phosphate as a solid powder is dispersed in the solvent.

A number of solvents may be used in the doping composition. In many embodiments, the doping composition may be a non-aqueous doping composition. In many embodiments, the solvent may be an organic solvent. For example, the solvent may be selected from alcohols, aldehydes, ketones, carboxylic acids, esters, amines, organosiloxanes, halogenated hydrocarbons, other hydrocarbon solvents and combinations thereof. In some embodiments, more than one solvent may be used. The use of more than one solvent may allow for tuning one or more physical properties of the doping composition such as viscosity, density and/or polarity.

In some embodiments, the doping composition may be in a form of a paste.

In some embodiments, the doping composition may be in a form of a non-Newtonian or a shear-thinning fluid. Non-Newtonian fluid refers to a fluid whose flow properties are not described by a single constant value of viscosity, or resistance to flow. Shear thinning refers to a fluid whose viscosity decreases with increasing rate of shear. In general, shear thinning behavior is observed in colloidal suspensions, where the weak hydrostatic and electrostatic interaction between particles and their surface groups tends to increase viscosity in non-dynamic force regimes. The addition of a relatively small shear force overcomes the hydrostatic interaction and thus tends to reduce the viscosity of the fluid.

In some embodiments, the doping composition may further comprise a binder or binding material. Such a binder may be used for adjusting a viscoelastic behavior of the composition. A binder may be a high molecular weight molecule which may contain no OH groups, or may contain one or more OH groups. In some embodiments, the binder may comprise a polymer. Examples of polymer binder materials include polyacrylates, polymetacrylates, polyacetals, polyvinyls, a cellulose (including its ethers and esters), and copolymers thereof. The amount of the binding polymer may vary. In some embodiments, the doping composition may include the binding polymer in the amount from 0.1 to 20 weight % or from 0.2 to 15 weight % or from 0.5 to 5 weight % or from 1 to 4 weight % or any subrange within these ranges.

In some embodiments, the doping composition may further include a matrix, which may be an inert matrix, i.e. a matrix that does not react with an inorganic salt of a phosphor containing acid and a semiconductor being doped. The matrix may be used for modifying viscoelastic properties of the composition. The matrix may comprise particles, such as nanoparticles. In certain embodiments, the particles or nanoparticles may be semiconductor or metal oxide particles or nanoparticles. In some embodiments, the particles or nanoparticles may be ceramic particles or nanoparticles. For example, the particles or nanoparticles may include one or more of the following materials: SiN, $SiO_2$, SiC, $TiO_2$, $Al_2O_3$, MgO, CaO, $Li_2O$, BeO, SrO, $SC_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Ta_2O_5$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$ and $HfO_2$, elemental Carbon, elemental Silicon, and combinations thereof. In a certain embodiments, the particles or nanoparticles may be $SiO_2$ particles or nanoparticles. The amount of the matrix in the doping composition may vary. In some embodiments, the doping composition may include the matrix in the amount from 0.1 to 99 weight % or from 0.2 to 90 weight % or from 0.5 to 80 weight % from 1 to 50 weight % or any subrange within these ranges.

Following the contacting the doping composition, the substrate may be heated so that phosphorous atoms of the inorganic salt of the phosphor containing acid could diffuse into the substrate and thereby dope it. The heating temperature may depend on a number of parameters, such as parameters of the doping composition and parameters of the semiconductor being doped. In some embodiments, the heating temperature may be at least 600° C. or at least 650° C. or at least 700° C. or at least 750° C. or at least 800° C. or at least 850° C. or at least 900° C. or at least 950° C. or at least 1000° C.

In some embodiments, the heating may be performed in a non-oxidizing gas atmosphere, i.e. an atmosphere that does not contain oxygen. The non-oxidizing gas atmosphere may comprise one or more of inert gases, such as helium, neon or argon, and/or nitrogen.

Yet in some embodiments, the heating of the substrate may be performed in an oxygen containing atmosphere. In some embodiments, the oxygen containing atmosphere may contain only oxygen. Yet in some embodiments, the oxygen containing atmosphere may contain no more than 20% or no more than 18% or no more than 16% or no more than 14% or no more than 12% or no more than 10% or no more than 9% or no more than 8% or no more than 7% or no more than 6% or no more than 5% or no more than 4% or no more than 3% or no more than 2% or no more than 1% of oxygen. In some embodiments, the oxygen content in the oxygen containing atmosphere may be from 0.1% to 20% or from 0.2% to 15% or from 0.5% to 10% or from 1% to 7%. Besides oxygen, the oxygen containing atmosphere may include one or more other gases, such as an inert gas, e.g. argon, helium, neon, and nitrogen.

In some embodiments, the doping composition may be deposited on the whole surface of the substrate. Yet in some embodiments, the doping composition may be deposited on at least a portion of a surface of the substrate. A number of deposition techniques can be used, including drop casting, spin casting and printing, such as ink jet printing and screen printing. In some embodiments, the doping composition may be deposited only at a portion of the surface of the substrate, so that the remaining surface of the substrate is free of the doping composition.

In some embodiments, the doping composition may be deposited in a pattern.

In some embodiments, the doping composition may be deposited on the surface of the substrate to form a feature, which has at least one characteristic dimension, such as a length or a width, equal to or greater than characteristic dimensions of the substrate. In some embodiments, the doping composition may be deposited on the surface of the substrate to form a feature, which has at least one characteristic dimension, such as a length or a width, no more or less than 156 mm or no more or less than 125 mm or no more or less than 100 mm or no more or less than 90 mm or no more or less than 80 mm or no more or less than 70 mm or no more or less than 60 mm or no more or less than 50 mm or no more or less than 40 mm or no more or less than 30 mm or no more or less than 20 mm or no more or less than 15 mm or no more or less than 10 mm or no more or less than 5 mm or no more or less than 3 mm or no more or less than 2 mm or no more or less than 1 mm or no more or less than 0.5 mm or no more or less than 0.2 mm or no more or less than 0.05 mm. In some embodiments, the doping composition may be deposited on the surface of the substrate to form a feature, which has each of its two characteristic dimensions such as a length and a width, no more or less than 100 mm or no more or less than 90 mm or no more or less than 80 mm or no more or less than 70 mm or no more or less than 60 mm or no more or less than 50 mm or no more or less than 40 mm or no more or less than 30 mm or no more or less than 20 mm or no more or less than 15 mm or no more or less than 10 mm or no more or less than 5 mm or no more or less than 3 mm or no more or less than 2 mm or no more or less than 1 mm or no more or less than 0.5 mm or no more or less than 0.2 mm or no more or less than 0.05 mm. The individual feature may have a regular or irregular shape. Non-limiting examples of regular shapes include squares, circles, rectangles and ellipses.

The minimal size of the deposited feature may depend on a number of parameters, such as a morphology (roughness) of the substrate's surface and viscoelastic properties of the doping composition.

In some embodiments, the doping composition may be deposited on the surface of the substrate that an area of the substrate not covered by the composition forms a feature, which has at least one characteristic dimension, such as a length or a width, equal to or greater than characteristic dimensions of the substrate. In some embodiments, the doping composition may be deposited on the surface of the substrate that an area of the substrate not covered by the composition forms a feature, which has at least one characteristic dimension, such as a length or a width, no more or less than 156 mm or no more or less than 125 mm or no more or less than 100 mm or no more or less than 90 mm or no more or less than 80 mm or no more or less than 70 mm or no more or less than 60 mm or no more or less than 50 mm or no more or less than 40 mm or no more or less than 30 mm or no more or less than 20 mm or no more or less than 15 mm or no more or less than 10 mm or no more or less than 5 mm or no more or less than 3 mm or no more or less than 2 mm or no more or less than 1 mm or no more or less than 0.5 mm or no more or less than 0.2 mm or no more or less than 0.05 mm. In some embodiments, the doping composition may be deposited on the surface of the substrate that an area of the substrate not covered by the composition forms a feature, which has each of its two characteristic dimensions such as a length and a width, no more or less than 156 mm no more or less than 125 mm no more or less than 100 mm no more or less than 90 mm no more or less than 80 mm or no more or less than 70 mm no more or less than 60 mm no more or less than 50 mm no more or less than 40 mm no more or less than 30 mm or no more or less than 20 mm no more or less than 15 mm or no more or less than 10 mm or no more or less than 5 mm or no more or less than 3 mm or no more or less than 2 mm or no more or less than 1 mm or no more or less than 0.5 mm or no more or less than 0.2 mm or no more or less than 0.05 mm. The individual feature may have a regular or irregular shape. Non-limiting examples of regular shapes include squares, circles, rectangles and ellipses.

In some embodiments, the doping composition may be deposited in such a way that it forms on the surface of the substrate multiple, i.e. two or more, features, which may or may not be covered by the doping composition. In some embodiments, the multiple features may form a pattern on the surface of the substrate. In some embodiments, a distance between two closest features of the same type, i.e. two features covered by the doping composition or two features non covered by the doping composition, may be no more or less than 100 mm no more or less than 90 mm no more or less than 80 mm no more or less than 70 mm no more or less than 60 mm no more or less than 50 mm no more or less than 40 mm or no more or less than 30 mm or no more or less than 20 mm or no more or less than 15 mm or no more or less than 10 mm or no more or less than 5 mm or no more or less than 3 mm or no more or less than 2 mm or no more or less than 1 mm or no more or less than 0.5 mm or no more or less than 0.2 mm or no more or less than 0.05 mm.

When the doping composition is deposited on the substrate's surface in such a way that one portion of the substrate's surface is covered by the doping composition, while another portion of the substrate's surface is not covered by the doping composition, it may be preferred that heating of the substrate would result in a stronger doping (due to a diffusion of phosphorous atoms of the inorganic salt of the phosphor containing acid of the doping composition) of the portion of the substrate covered by the doping composition compared to the portion of the substrate not covered by the doping composition. For example, upon the heating of the N-type substrate, the sheet resistance of the portion of the substrate covered by the N-type doping composition may become at least 1.2 times less or at least 1.5 times less or at least 2 times less or at least 5 times less or at least 10 times less or at least 20 less or at least 30 times or at least 50 times less or at least 100 times less or at least 200 times less or at least 500 times less or at least 1000 less than the resistivity of the portion of the substrate not covered by the doping composition. In some embodiments, the phosphorous atoms of the doping composition may diffuse into the portion of the substrate that does not have its surface covered by the doping composition, which may occur due to gas phase transfer of the phosphorus dopant from the doping composition to uncovered surface during the heating step (autodoping effect). Such diffusion may result in doping of the portion of the substrate that does not have its surface covered by the doping composition. This, often undesirable effect, may be reduced and/or eliminated by performing the heating of the substrate in an oxygen containing atmosphere, such as the ones discussed above. The undesirable diffusion may be also reduced and/or eliminated by making modifications to the doping composition, such as decreasing the concentration of the inorganic salt of the phosphor containing acid and/or using a matrix, such as the one discussed above, in the doping composition.

A number of methods may be used for depositing a doping composition. For example, when a doping composition is dispersion, such as a paste, deposition methods include, but are not limited to, screen printing, roll coating, slot die coating, gravure printing, flexographic drum printing, and inkjet printing methods. In some embodiments, screen printing may be particularly beneficial for the deposition of the doping composition in a paste form since this deposition method is commonly used in solar cell manufacturing for the deposition of front and rear metal pastes. For the better printing efficiency and performance, the doping composition may be preferred to be in a form of a non-Newtonian or shear-thinning fluid. The viscosity of the doping composition may be preferred to be relatively low at high shear rates in order to pass through a screen pattern, but relatively high prior to and after deposition (at low or zero shear rates), such that the doping composition will not run through the screen or on the substrate surface respectively.

The doping composition may be prepared by mixing one or more inorganic salts of a phosphor containing acid and one or more solvents. The inorganic salt(s) may be in a form of a powder. In such a case, the mixing may result in forming a dispersion of the inorganic salt(s) in the solvent(s). In some embodiments, it may be preferred to homogenize the dispersion to form a homogeneous dispersion containing the inorganic salt dispersed in the solvent. For forming the homogeneous dispersion, one may use a high shear mixer, such as a planetary mixer. Additional ingredients of the doping composition, such as a binding polymer and/or a matrix, may be added to the dispersion prior, during or post the homogenizing.

The present doping compositions comprising an inorganic salt of a phosphor containing acid may be used for a number of applications, including manufacturing semiconductor electronic devices, such as solar cells.

The present inventor also discovered that certain inorganic salts, such as $Ca(H_2PO_4)_2$, $MgHPO_4$, $Mg_3(PO_4)_2$, $Zr(HPO_4)_2$ and combinations thereof, may be used for doping a semiconductor. In some embodiments, such a doping process may be performed by contacting such a salt with a semiconductor. For example, in some embodiments, the salt may be as a part of a doping composition disclosed above.

Embodiments described herein are further illustrated by, though in no way limited to, the following working examples.

EXAMPLE

TABLE 1

| Phosphate of | Chemical structure | Ink ID | SRO*, Ohm/sq | Doping type |
|---|---|---|---|---|
| Aluminum | $Al(H_2PO_4)_3$ | ADP | 9-14 | N |
| | | ADP/A7 | 20-24 | N |
| | $Al(PO_3)_3$ | AMP | 180-280 | N |

TABLE 1-continued

| Phosphate of | Chemical structure | Ink ID | SRO*, Ohm/sq | Doping type |
|---|---|---|---|---|
| Calcium | $Ca_3(PO_4)_2$ | CP | 75-90 | P |
|  | $Ca(H_2PO_4)_2$ | CPM | 20-24 | N |
|  | $CaHPO_4$ | CHP | 75-95 | P |
|  |  | CHP/A7 | 80-100 | P |
|  | $Ca_2P_2O_7$ | CPP | 70-100 | P |
| Magnesium | $Mg_3(PO_4)_2 \cdot 8H_2O$ | MP | 90-100 | P |
|  | $MgHPO_4 \cdot 3H_2O$ | MHP | 180-350 | N |
|  |  | MHP/A7 | 80-150 | P |
|  | $Mg_3(PO_4)_2 \cdot xH_2O$ | MPH | 120-230 | N |
| Zirconium | $Zr(HPO_4)_2$ | ZHP | 110-200 | N |
| Sodium | $Na_4P_2O_7$ | SPP | 70-80 | P |

*Measurement in "Ink" areas after diffusion in Nitrogen ambient

Table 1 gives an overview of inorganic phosphates used in doping pastes to create N-type doping of P-type Si substrates.

The inorganic phosphate-containing doping pastes were produced by dispersing an inorganic phosphate powder of choice (See Table 1) in a 1:1 mixture of terpineol and dihydro-terpineol (T:D=1:1), and 15 wt. % solution of Poly(butyl methacrylate) (PBMA) in T:D=1:1 used as polymer binder. The phosphate content varied from 38 wt. % to 68 wt. %. Content of PBMA varied from 2 to 3 wt. %. Additionally, three of the inorganic phosphate-containing doping pastes contained 7 wt. % of hydrophobically treated submicron Silica powder (A7).

A first inorganic phosphate-containing doping paste (ADP), as deposited on P-type substrate, was comprised of a mixture of 68 wt. % Aluminum dihydrogen phosphate (ADP), 3 wt. % of PBMA binder and 29 wt. % of T:D 1:1 solvent.

A second inorganic phosphate-containing doping paste (ADP/A7), as deposited on P-type substrate, was comprised of a mixture of 38.6 wt. % Aluminum dihydrogen phosphate (ADP) and 7 wt. % of hydrophobically treated submicron Silica powder (A7), 2.2 wt. % of PBMA binder and 52.2 wt. % of T:D 1:1 solvent.

A third inorganic phosphate-containing doping paste (AMP), as deposited on P-type substrate, was comprised of a mixture of 70 wt. % Aluminum metaphosphate (AMP), 3.1 wt. % of PBMA binder and 26.9 wt. % of T:D 1:1 solvent.

A fourth inorganic phosphate-containing doping paste (CP), as deposited on P-type substrate, was comprised of a mixture of 68 wt. % Calcium phosphate (CP), 3 wt. % of PBMA binder and 29 wt. % of T:D 1:1 solvent.

A fifth inorganic phosphate-containing doping paste (CPM), as deposited on P-type substrate, was comprised of a mixture of 62.9 wt. % Calcium phosphate monobasic (CPM), 2.8 wt. % of PBMA binder and 34.3 wt. % of T:D 1:1 solvent.

A six inorganic phosphate-containing doping paste (CHP), as deposited on P-type substrate, was comprised of a mixture of 68 wt. % Calcium hydrogen phosphate (CHP), 3 wt. % of PBMA binder and 29 wt. % of T:D 1:1 solvent.

A seventh inorganic phosphate-containing doping paste (CHP/A7), as deposited on P-type substrate, was comprised of a mixture of 38 wt. % Calcium hydrogen phosphate (CHP), 7 wt. % of hydrophobically treated submicron Silica powder A7, 2.2 wt. % of PBMA binder and 52.8 wt. % of T:D 1:1 solvent.

An eighth inorganic phosphate-containing doping paste (CPP), as deposited on P-type substrate, was comprised of a mixture of 69.9 wt. % Calcium pyrophosphate (CPP), 3 wt. % of PBMA binder and 27.1 wt. % of T:D 1:1 solvent.

A ninth inorganic phosphate-containing doping paste (MP), as deposited on P-type substrate, was comprised of a mixture of 49.5 wt. % Magnesium phosphate tribasic octahydrate (MP), 2.8 wt. % of PBMA binder and 47.7 wt. % of T:D 1:1 solvent.

A tenth inorganic phosphate-containing doping paste (MHP), as deposited on P-type substrate, was comprised of a mixture of 52.8 wt. % Magnesium hydrogen phosphate trihydrate (MHP), 2.9 wt. % of PBMA binder and 44.3 wt. % of T:D 1:1 solvent.

An eleventh inorganic phosphate-containing doping paste (MHP/A7), as deposited on P-type substrate, was comprised of a mixture of 38.8 wt. % Magnesium hydrogen phosphate trihydrate (MHP), 7 wt. % of hydrophobically treated submicron Silica powder A7, 2.2 wt. % of PBMA binder and 52 wt. % of T:D 1:1 solvent.

A twelfth inorganic phosphate-containing doping paste (MPH), as deposited on P-type substrate, was comprised of a mixture of 44.7 wt. % Magnesium phosphate hydrate (MPH), 3.2 wt. % of PBMA binder and 52.1 wt. % of T:D 1:1 solvent.

A thirteenth inorganic phosphate-containing doping paste (ZHP), as deposited on P-type substrate, was comprised of a mixture of 68 wt. % Zirconium(IV) hydrogenphosphate (ZHP), 3 wt. % of PBMA binder and 29 wt. % of T:D 1:1 solvent.

A fourteenth inorganic phosphate-containing doping paste (SPP), as deposited on P-type substrate, was comprised of a mixture of 70 wt. % Sodium pyrophosphate (SPP), 3.1 wt. % of PBMA binder and 26.9 wt. % of T:D 1:1 solvent.

To prepare the paste, all components of the paste were placed in a jar, and mixed together with a high shear planetary mixer (Thinky brand) to create a homogeneous dispersion. Consequently, each inorganic phosphate-containing doping paste was screen-printed onto P-type silicon substrates with bulk sheet resistance of 80-110 Ohm/sq that were preliminary cleaned in an aqueous acidic solution containing 7% of HF and 5% of HCl, rinsed with de-ionized water (DI water), and spin-dried.

FIG. 1 shows the printing pattern for the inorganic phosphate-containing doping pastes. After deposition, each substrate went directly through in-line dryer of the screen printer at 200° C. for ~1 minute to remove the solvent.

In order to diffuse the N-type dopant into the P-type substrate (diffusion step), printed P-type substrates were placed next in a hot wall diffusion tube and heated at about 900° C. or 925° C. for about 60 minutes.

One set of substrates was diffused in inert $N_2$ ambient, while another set was diffused in $N_2$ ambient containing 3% of Oxygen.

To remove the paste residue from the surface after diffusion the substrates were exposed for 6 min to an aqueous acidic solution containing 7% of HF and 5% of HCl, rinsed with DI water, sonicated in DI water for 10 min, and then rinsed again in DI water and spin-dried.

Doping under the patches of inorganic phosphate-containing doping pastes and in the unprinted areas between the ink patches was then tested via a sheet resistance measurement using a four point probe instrument. The higher sheet resistance values indicated lower doping strength in the measurement location, for a given majority carrier. Majority carrier type in the printed and not-printed areas was determined using a hot-probe measurement. FIG. 1 shows the measurements locations in printed areas ("Ink") and areas between them ("No Ink").

FIG. 2A is a plot of a sheet resistance of printed areas on P-type substrates as generated with a variety of the inorganic phosphate-containing doping pastes after diffusion process in inert (Nitrogen) ambient. Vertical axis shows the measured sheet resistance in Ohm/square as measured for substrate areas underneath the inorganic phosphate-containing doping pastes ('Ink').

In FIG. 2A, for inks diffused at 900° C. the areas under the inorganic phosphate-containing doping paste containing AMP were substantially N-type ('Ink'), with a sheet resistance between about 180 Ohm/sq and about 280 Ohm/sq, with an average of about 210 Ohm/sq. The areas under the ink were substantially P-type ('Ink') for the doping pastes containing CPP and SPP, with a sheet resistance between about 70 Ohm/sq and about 100 Ohm/sq, and between about 70 Ohm/sq and about 80 Ohm/sq, respectively.

In FIG. 2A, for inks diffused at 925° C. the areas under the ADP inorganic doping paste containing ADP were substantially N-type ('Ink'), with a sheet resistance between about 9 Ohm/sq and about 14 Ohm/sq, with an average of about 11 Ohm/sq. For the inorganic phosphate-containing doping paste containing ADP and a hydrophobically treated submicron Silica powder as matrix material (ADP/A7) the areas under the ink were substantially N-type ('Ink'), with a sheet resistance between about 20 Ohm/sq and about 24 Ohm/sq, with an average of about 22 Ohm/sq.

For the inorganic doping pastes containing various Calcium phosphates, the areas under the CHP paste were substantially P-type ('Ink'), with a sheet resistance between about 75 Ohm/sq and about 95 Ohm/sq, with an average of about 85 Ohm/sq; for the paste containing CHP and a hydrophobically treated submicron Silica powder as matrix material (CHP/A7) the areas under the ink were substantially P-type ('Ink'), with a sheet resistance between about 80 Ohm/sq and about 100 Ohm/sq, with an average of about 90 Ohm/sq; the areas under the CP paste were substantially P-type ('Ink'), with a sheet resistance between about 70 Ohm/sq and about 90 Ohm/sq, with an average of about 80 Ohm/sq; and the areas under the CPM containing doping paste were substantially N-type ('Ink'), with a sheet resistance between about 20 Ohm/sq and about 24 Ohm/sq, with an average of about 22 Ohm/sq. under these diffusion conditions.

For the inorganic doping pastes containing different Magnesium phosphates, the areas under the MHP paste were substantially N-type ('Ink'), with a sheet resistance between about 180 Ohm/sq and about 350 Ohm/sq, with an average of about 265 Ohm/sq; for the paste containing MHP and a hydrophobically treated submicron Silica powder as matrix material (MHP/A7) the areas under the ink were substantially P-type ('Ink'), with a sheet resistance between about 80 Ohm/sq and about 150 Ohm/sq, with an average of about 115 Ohm/sq; the areas under the MP paste were substantially P-type ('Ink'), with a sheet resistance between about 90 Ohm/sq and about 100 Ohm/sq, with an average of about 95 Ohm/sq; and the areas under the MPH containing doping paste were substantially N-type ('Ink'), with a sheet resistance between about 120 Ohm/sq and about 230 Ohm/sq, with an average of about 175 Ohm/sq, under these diffusion conditions.

For the doping paste containing Zirconium phosphate ZHP, the areas under the ZHP paste were substantially N-type ('Ink'), with a sheet resistance between about 110 Ohm/sq and about 200 Ohm/sq, with an average of about 155 Ohm/sq; under these diffusion conditions. FIG. 2B demonstrates N-type doping under the ink covered areas as generated with the same set of inorganic phosphate-containing doping pastes, as for described above diffusion process at 925° C., when the same diffusion process performed in oxidative ambient of Nitrogen with 3% of Oxygen.

FIG. 3 is a plot of a sheet resistance of empty areas between ink patches ("No Ink" areas) on P-type substrates as generated with a variety of the inorganic phosphate-containing doping pastes after diffusion process. These areas were substantially P-type for the pastes containing SPP, MP, and MPH with the sheet resistance of 70-95 Ohm/sq, which is comparable to the bulk resistivity of the P-type substrates used. However, while these areas were substantially P-type for the pastes containing CPP, CHP, and CP, the sheet resistance values varied from about 70 Ohm/sq to about 180 Ohm/sq, where upper value was higher than the bulk resistivity of the P-type substrates used.

The "No Ink" areas were ether P-type or N-type with the sheet resistance of 90-300 Ohm/sq for the CHP/A7 paste, with the sheet resistance of 80-180 Ohm/sq for the MHP paste, and with the sheet resistance of 80-380 Ohm/sq for the MHP/A7 paste.

The "No Ink" areas were substantially N-type for the AMP, ADP, ADP/A7, CPM and ZHP pastes. The sheet resistance values showed a wide range, with sheet resistance of 220-410 Ohm/sq, 65-300 Ohm/sq, 220-410 Ohm/sq, 250-400 Ohm/sq and 120-600 Ohm/sq respectively.

These increased sheet resistance of P-type substrates, mixed P- and N-type doping, and pure N-type doping of the areas of P-type substrate, where the inorganic phosphate-containing doping pastes were not deposited, during diffusion process, were attributed to an "autodoping" process. Such process described as a gas phase transfer of Phosphorus dopant from the N-type paste patches into uncovered areas during diffusion process, as illustrated by FIG. 4. The gas transfer delivery of the dopant atoms to uncovered areas of substrate may result in a diffusion of Phosphorus atoms in these areas, and consequently into N-type doping in the field areas not covered with the N-type doping paste.

It worth noticing that the autodoping was less severe (sheet resistance was higher) for MHP and ADP containing doping pastes, when A7 matrix was present together with the dopant in the paste (MHP/A7 and ADP/A7) compare to the pastes containing dopant itself only. It demonstrates that autodoping depends on the paste composition.

FIG. 5 is a plot of a sheet resistance of empty areas between ink patches ("No Ink" areas) on P-type substrates as generated with a variety of the inorganic phosphate-containing doping pastes after diffusion processes in inert (Nitrogen) and oxidative (Nitrogen+3% Oxygen) ambient. The plot demonstrates that all "No Ink" areas became substantially P-type for the CHP, CHP/A7, MHP and MHP/A7 pastes, when Oxygen was added to the ambient. In the presence of Oxygen some "No Ink" areas became P-type for the CPM paste, and while all "No Ink" areas remained substantially N-type, the doping became lighter (Sheet resistance increased by about 100 Ohm/sq) for the ADP paste.

Thus, an autodoping effect from the CHP, CHP/A7, MHP, MHP/A7, CPM and ADP doping pastes was suppressed by addition of Oxygen to the diffusion ambient. It demonstrates that while autodoping may present a certain challenge to create selectively doped areas, it can be controlled, at least to some degree by a diffusion process ambient.

Consequently, it is shown that the pastes containing such inorganic phosphates as ADP, CPM, ZHP, MPH and MHP demonstrated patterned N-type counter-doping of the P-type substrates with Phosphorus (N-type) dopant.

Additionally, it was demonstrated that the autodoping effect resulting from gas phase transfer of Phosphorus dopant from the paste's covered areas to non-printed areas, can be controlled, at least to some degree by the diffusion process ambient, the paste composition and the phosphate chemical structure.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention.

All of the publications, patent applications and patents cited in this specification are incorporated herein by reference in their entirety.

What is claimed is:

1. A semiconductor doping method comprising:
    (A) obtaining a substrate comprising a semiconductor material and
    (B) contacting at least a portion of a surface of the substrate with a non-aqueous doping composition comprising a) an organic solvent and b) an inorganic salt dispersed in said solvent, wherein the salt is selected from the group consisting of $Al(H_2PO_4)_3$, $Al(PO_3)_3$, $Ca_3(PO_4)_2$, $CaHPO_4$, $Ca(H_2PO_4)_2$, $Ca_2P_2O_7$, $MgHPO_4$, $Mg_3(PO_4)_2$, $Zr(HPO_4)_2$, $Na_4P_2O_7$ and combinations thereof.

2. The method of claim 1, wherein the substrate comprises silicon.

3. The method of claim 1, wherein the doping composition is a non-Newtonian fluid.

4. The method of claim 1, wherein the doping composition does not comprise a phosphor-containing acid or a phosphorous oxide.

5. The method of claim 1, wherein the solvent is selected from the group consisting of alcohols, aldehydes, ketones, carboxylic acids, esters, amines, organosiloxanes, halogenated hydrocarbons, hydrocarbons and combinations thereof.

6. The method of claim 1, wherein the doping composition further comprises a binding polymer.

7. The method of claim 6, wherein said binding polymer is selected from polyacrylates, polyacetals, polyvinyls, cellulose, cellulose ethers and esters, and copolymers thereof.

8. The method of claim 1, wherein the doping composition further comprises a matrix material.

9. The method of claim 8, wherein the matrix material comprises nanoparticles.

10. The method of claim 1 further comprising heating the substrate, wherein said heating results in diffusing of phosphorous atoms of the inorganic salt into the substrate.

11. The method of claim 1, wherein said contacting comprises printing the doping composition on the at least portion of the surface of the substrate.

12. The method of claim 11, wherein said printing comprises screen printing.

13. The method of claim 1, wherein said contacting is such that a first portion of the surface of the substrate is covered by the doping composition, while a second portion of the surface of the substrate is not covered by the doping composition.

14. The method of claim 13 further comprising heating the substrate, wherein the heating results in doping the first portion of the surface of the substrate with phosphorous atoms of the inorganic salt and wherein the second portion of the surface of the substrate is not doped.

15. A semiconductor doping method comprising:
    (A) obtaining a substrate comprising a semiconductor material and
    (B) contacting at least a portion of a surface of the substrate with a non-aqueous doping composition comprising a) an organic solvent, b) an inorganic salt dispersed in said solvent and c) a binding polymer, wherein the salt is selected from the group consisting of $Al(H_2PO_4)_3$, $A^1(PO_3)_3$, $Ca_3(PO_4)_2$, $CaHPO_4$, $Ca(H_2PO_4)_2$, $Ca_2P_2O_7$, $MgHPO_4$, $Mg_3(PO_4)_2$, $Zr(HPO_4)_2$, $Na_4P_2O_7$ and combinations thereof, and wherein the doping composition is a non-Newtonian fluid.

* * * * *